(12) United States Patent
Ibok

(10) Patent No.: US 6,319,857 B1
(45) Date of Patent: *Nov. 20, 2001

(54) METHOD OF FABRICATING STACKED N-O-N ULTRATHIN GATE DIELECTRIC STRUCTURES

(75) Inventor: Effiong E. Ibok, Sunnyvale, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/714,915

(22) Filed: Sep. 16, 1996

(51) Int. Cl.$^7$ .................................................. H01L 21/469
(52) U.S. Cl. ..................... 438/786; 438/787; 438/769; 438/287; 438/216; 438/591; 438/264; 438/261
(58) Field of Search ..................... 438/761, 778, 438/786, 787, 769, 790, 287; 436/264, 261, 216, 591, 287

(56) References Cited

U.S. PATENT DOCUMENTS

| | | | |
|---|---|---|---|
| 4,980,307 | * 12/1990 | Ito et al. ........................... | 438/591 |
| 5,266,509 | * 11/1993 | Chen ................................. | 438/591 |
| 5,338,954 | * 8/1994 | Shimoji ............................ | 257/326 |
| 5,464,783 | * 11/1995 | Kim et al. . | |
| 5,550,078 | * 8/1996 | Sung ................................ | 438/253 |
| 5,631,179 | * 5/1997 | Sung et al. ....................... | 438/790 |
| 5,674,788 | * 10/1997 | Wristers et al. .................. | 438/301 |
| 5,700,731 | * 12/1997 | Lin et al. ......................... | 438/254 |
| 5,926,741 | * 7/1999 | Matsuoka et al. ................ | 438/778 |

FOREIGN PATENT DOCUMENTS

358017673 * 2/1983 (JP) .

OTHER PUBLICATIONS

Wolf "silicon processing for the VLSI ERA" vol. 1, pp. 198–200, 1986.*
Sze "VLSI Technology" pp. 115–122, 1986.*

* cited by examiner

Primary Examiner—Charles Bowers
Assistant Examiner—Thanh Nguyen
(74) Attorney, Agent, or Firm—Sawyer Law Group LLP

(57) ABSTRACT

The present invention is an improved semiconductor device and an improved method of manufacturing a semiconductor device. The present invention deposits a layer of oxynitride where gate oxidation would normally take place. Alternatively, the method according to the present invention uses a plurality of layers of dielectric material where gate oxidation would normally take place including a layer of oxynitride having a nitrogen content. The layer of oxynitride is deposited under a predetermined pressure using a stream of gas, wherein insensitivity to defects on a surface of the substrate results from the oxynitride layer.

13 Claims, 5 Drawing Sheets

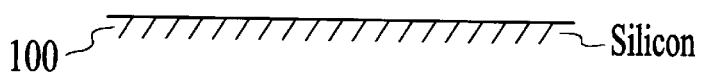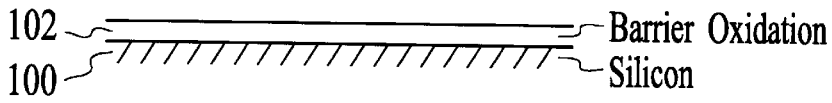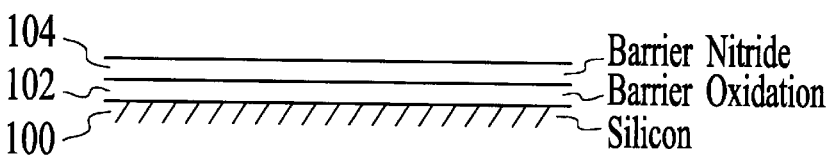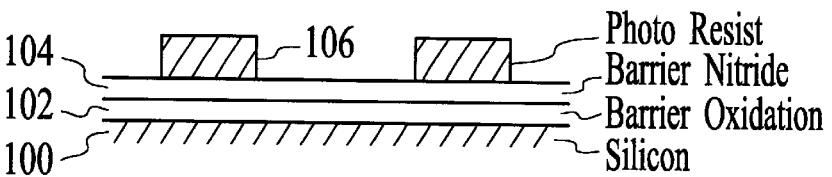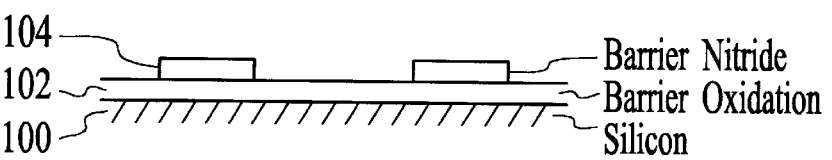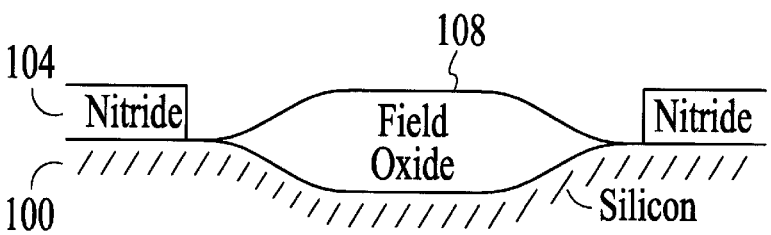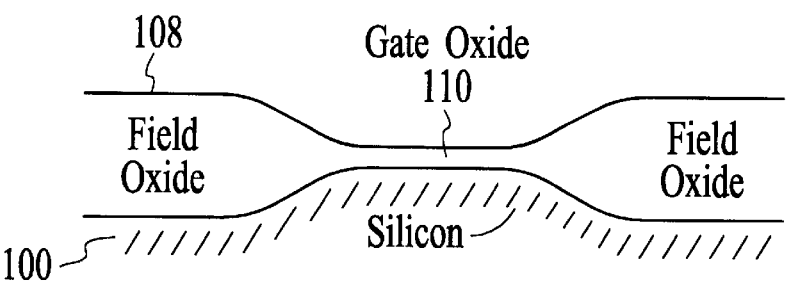

METHOD OF FABRICATING STACKED N-O-N ULTRATHIN GATE DIELECTRIC STRUCTURES

FIELD OF THE INVENTION

The present invention relates to an improved semiconductor device and a method of manufacturing a semiconductor device.

BACKGROUND OF THE INVENTION

In the semiconductor industry, the basic steps of the conventional method of manufacturing P-doped gate structures have been fairly standardized. The process begins with the silicon substrate upon which a layer of barrier oxidation is positioned. After various steps, areas of field oxide become situated between block of barrier nitride. Gate oxide is then typically grown between the field oxide. This step of growing the gate oxide is generally referred to as "gate oxidation."

After various other steps, a block of polysilicon is situated above the gate oxide. Finally, boron difluoride ($BF_2$) is implanted in the polysilicon. Subsequent to the $BF_2$ implantation step, rapid thermal anneal (RTA) is typically initiated wherein the wafers are heated and the implants are activated and driven.

The conventional method of gate oxidation has several problems. One such problem is that it is typical for the surface of a silicon to have some particles on its surface. When an electrical stress is applied to the device with a particle on the silicon, the device will deteriorate much sooner than if the silicon had no particle on it.

Another problem prevalent in the conventional method for manufacturing semiconductor devices is caused by a defect located on the silicon. These defects can be created by the various steps taken in the manufacturing process utilizing temperature cycles and implantation. These defected areas have a tendency to leak charges, and consequently, will typically be much weaker than the other areas of the silicon.

A third problem appears when nitride is used in place of the gate oxide. When a plasma enhanced chemical vapor deposition (CVD) method is used for the nitride deposition, there will be an unavoidable given amount of hydrogen in the nitride. These hydrogen atoms cause a void in the matrix of elements and creates an excessive potential for cracking in the dielectric, thereby causing the device to be susceptible to any failures.

A further problem in the conventional methods for manufacturing semiconductor devices is caused by the use of $BF_2$ to dope polysilicon in P-channel devices. The boron from the $BF_2$ diffuses readily through the oxide, thereby degrading the oxide.

What is needed is an improved semiconductor device and improved method of manufacturing a semiconductor device which avoids the problems prevalent in the conventional methods. The present invention addresses such a need.

SUMMARY OF THE INVENTION

The present invention is an improved semiconductor device and an improved method of manufacturing a semiconductor device. The present invention deposits a layer of oxynitride where gate oxidation would normally take place. Alternatively, the method according to the present invention uses a plurality of layers of dielectric material where gate oxidation would normally take place including a layer of oxynitride having a nitrogen content. The layer of oxynitride is deposited under a predetermined pressure using a stream of gas, wherein insensitivity to defects on a surface of the substrate results from the oxynitride layer.

A method for manufacturing a semiconductor device according to the present invention is comprised of the steps of providing a substrate; providing a field oxide coupled to the substrate; providing a plurality of layers of dielectrics coupled to the substrate and the field oxide; providing a layer of polysilicon over the plurality of layers of dielectrics; and implanting a doping substance into the polysilicon layer, wherein the nitrogen content impedes diffusion of the doping substance through the field oxide.

Another method for manufacturing a semiconductor device according to the present invention is comprised of the steps of providing a substrate; providing a field oxide coupled to the substrate; depositing a layer of oxynitride over the substrate; and providing a layer of polysilicon over the oxynitride layer.

BRIEF DESCRIPTION OF THE DRAWINGS

FIGS. 1A–1K is an illustration of the basic conventional steps of manufacturing a semiconductor device.

DETAILED DESCRIPTION OF THE INVENTION

Figure 1H:
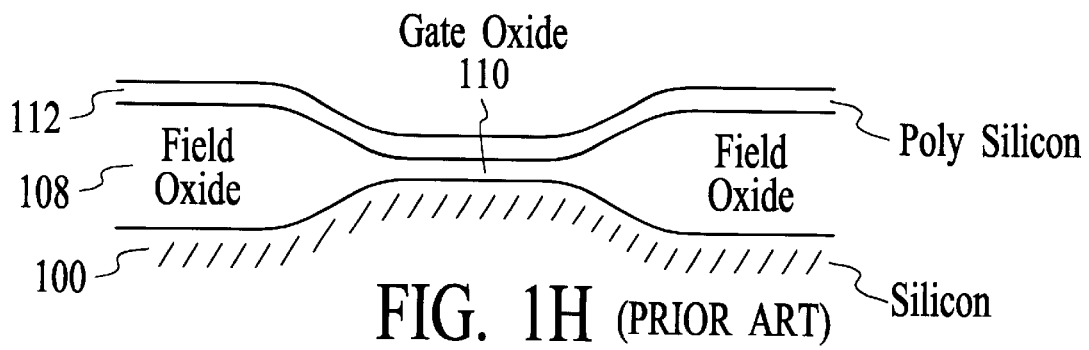

The present invention relates to a method of manufacturing a semiconductor device. More particularly, the present invention is an improvement on the gate oxidation step of the conventional method of manufacturing a semiconductor device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

FIG. 1 illustrates the basic steps of the conventional method of manufacturing P-doped gate structures. The process begins with the silicon substrate 100 as shown in FIG. 1A. A barrier oxidation layer 102 is positioned above the silicon 100 in FIG. 1B. A barrier nitride layer 104 is then positioned over the barrier oxidation layer 102 in FIG. 1C.

Photoresist 106 is then positioned over the barrier nitride 104 in FIG. 1D during the source/drain mask step of FIG. 1D. In FIG. 1E, the source/drain etch step leaves blocks of barrier nitride 104 over the barrier oxidation layer 102.

In FIG. 1F, the field oxidation step leaves the field oxide 108 between the barrier nitride blocks 104. The gate oxide 110 is then grown between the field oxide 108 as shown in FIG. 1G. As previously mentioned, this step of growing the gate oxide is referred to as "gate oxidation."

Figure 1I:
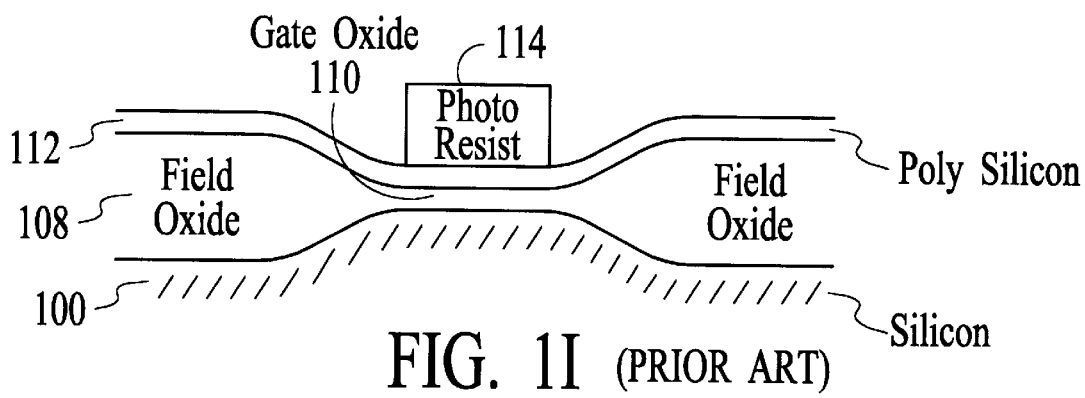
Figure 1J:
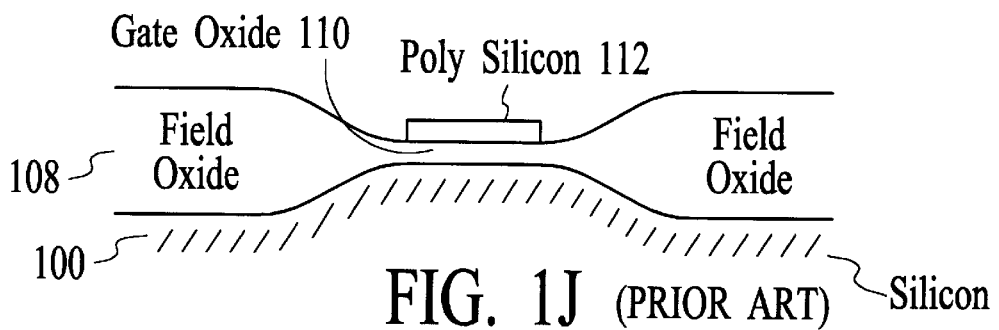

Next, a layer of polysilicon 112 is positioned over the field oxide 108 and the gate oxide 110 as shown in FIG. 1H. Then the photoresist 114 is placed above the polysilicon layer 112 as shown in FIG. 1I. The polygate etch step shown in FIG. 1J leaves a block of polysilicon 112 above the gate oxide 110.

Figure 1K:
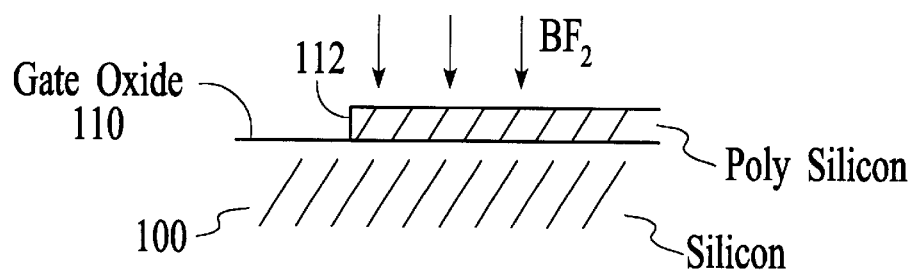

Finally, the $BF_2$ implantation step is shown in FIG. 1K where $BF_2$ is implanted in the polysilicon 112. Subsequent to the $BF_2$ implantation step, the rapid thermal anneal (RTA) step is initiated wherein the wafers are heated and the implants are activated and driven.

Figure 2A:
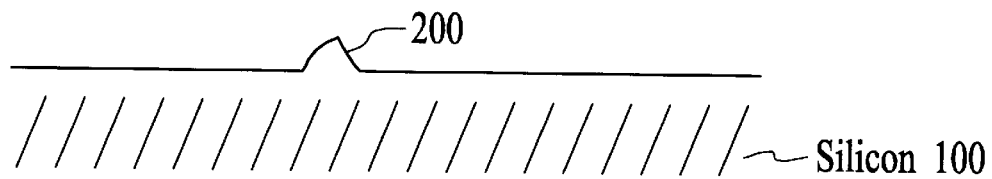
FIGS. 2A–2B is an illustration of a problem in the conventional method caused by a particle on the surface of the substrate.
Figure 2B:
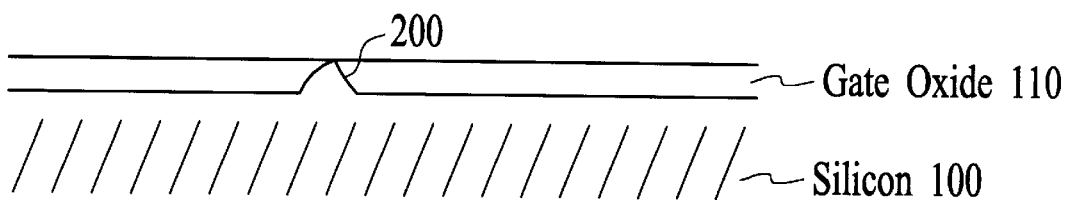

The conventional methods of gate oxidation have problems which are illustrated in FIGS. 2A–2B and 3A–3B. FIG. 2A shows a microscopic view of the silicon substrate 100. A particle 200 is shown on the surface of silicon 100. FIG. 2B shows the silicon 100 with the gate oxide 110 grown or deposited on silicon 100. Since oxide cannot be grown on top of particle 200, and the oxide can only grow if the silicon 100 can oxidize under the particle, at best, a very thin layer of oxide can be grown at the point in which particle 200 resides. When an electrical stress is applied to the device with a particle 200 on the silicon 100, the device will deteriorate much sooner than if the gate oxide 100 had been a uniform thickness over the silicon 100.

Figure 3A:
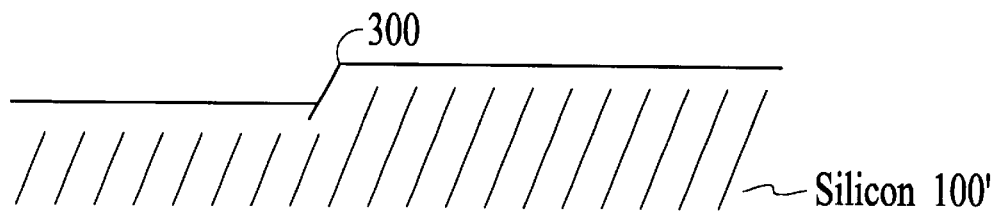
FIGS. 3A–3B is an illustration of another problem in the conventional method caused by a defect on the surface of the substrate.
Figure 3B:
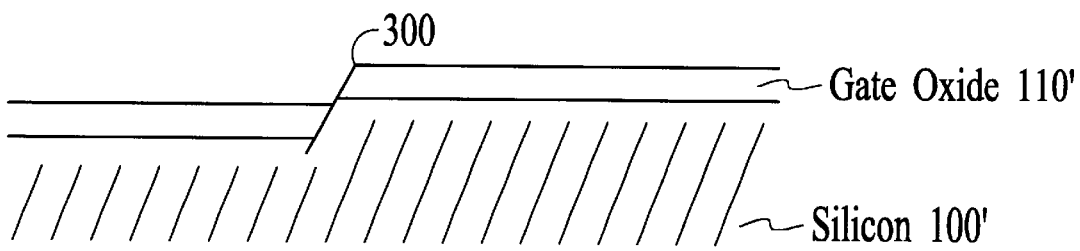

FIGS. 3A and 3B illustrate another problem prevalent in the conventional method for manufacturing semiconductor devices. In FIG. 3A, silicon 100' is shown with a defect 300 on its surface. When the gate oxide 110' is grown or deposited on upon the surface of the silicon 100', the oxidation at the point of the defect 300 will be very thin as shown in FIG. 3B. These defects 300 can be created via the various steps taken in the manufacturing process utilizing temperature cycles and implantation. These defected areas 300 have a tendency to leak charges. Consequently, the defected area 300 will typically be much weaker than the other areas of the silicon 100.

Some conventional manufacturing methods use nitride in place of the gate oxide. When a plasma enhanced chemical vapor deposition (CVD) nitride is used, there will be an unavoidable given amount of hydrogen in the nitride. The nitride is essentially a chain of elements which is ideally stoichiometric. In other words, it is desirable to have a continuous chain. However, when hydrogen bonds to either the silicon or the nitrogen, since hydrogen can only bond once, the chain of elements terminates, causing a void in the matrix. These voids become a nucleus for ruptures with propagating cracks when subjected to temperature cycling. This excessive potential for cracking in the dielectric itself causes the device to be susceptible to any failures.

Another problem in the conventional methods for manufacturing semiconductor devices is caused by the use of $BF_2$ to dope polysilicon in P-channel devices. The boron from the $BF_2$ diffuses readily through the oxide, thereby compromising reliability.

The present invention is an improved method for manufacturing a semiconductor device. The method according to the present invention has various embodiments which solves the problems which are in the conventional method.

Figure 4A:
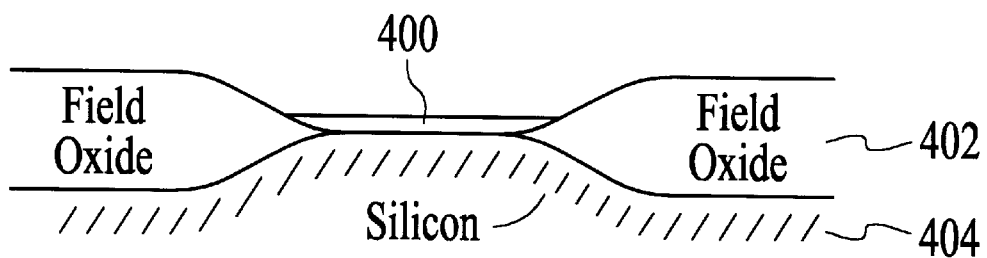
FIGS. 4A–4F is an illustration of the various embodiments of the present invention.

FIG. 4A shows a preferred embodiment of the present invention. In the gate oxidation step, shown in FIG. 1G, the step is improved by depositing oxynitride 400, typically less than 100 angstroms, in place of oxide. The deposition of the oxynitride 400 facilitates the avoidance of a thin oxide at the location of a particle on the substrate. Rather than growing the oxide on the silicon, the oxynitride layer 400 is deposited over the silicon including any particles which may reside on its surface. Additionally, due to the higher dielectric constant of the oxynitride, the actual thickness of the oxynitride layer 400 can be almost double the conventional oxide layer shown in FIG. 1G while still having an equivalent electrical thickness as the gate oxide shown in FIG. 1G. This thicker layer of oxynitride 400 is typically far easier to work with than the very thin layer of gate oxide.

The deposition mode may be any of the various means of nitride deposition with the additional requirement that a stream of nitrogen oxide gas, preferably $N_2O$ be added into the reaction stream. If the deposition is by PECVD, the process limitations may be as follows: power density <W/cm2 per deposition platen, pressure <6 torr, carrier gas flow rate less than 5 slm per deposition platen, silane flow rates less than 300 sccm, $NH_3/SiH_4$ ratio of less than 5 and $N_2O/SiH_4$ ratio of less than 10.

Figure 4B:
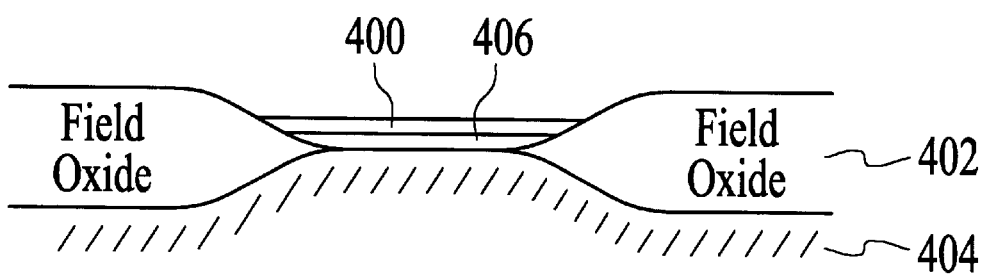

The remaining embodiments utilizes stacked dielectrics. The second embodiment is shown in FIG. 4B. In FIG. 4B, a layer of oxynitride 400 is deposited over a layer of oxide 406. The layer of oxide 406 can either be grown or deposited. The thickness of the oxide layer 406, combined with the oxynitride 400 preferably approximates the electrical thickness of the oxide layer used in the conventional method for manufacturing as shown in FIG. 1G.

Figure 4C:
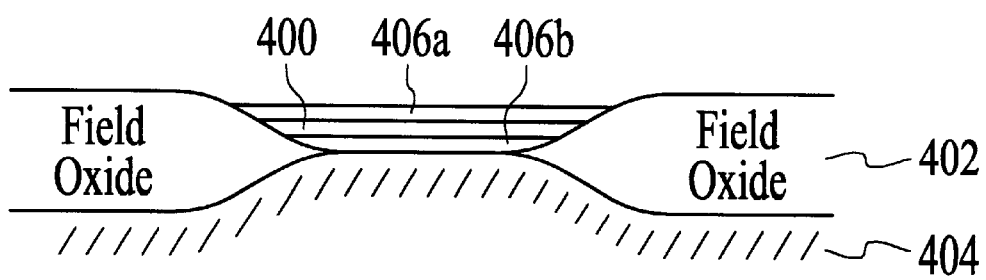

The third embodiment is shown in FIG. 4C which has an oxide layer 406A on top of an oxynitride layer 400 which in turn is on top of another oxide layer 406B.

Figure 4D:
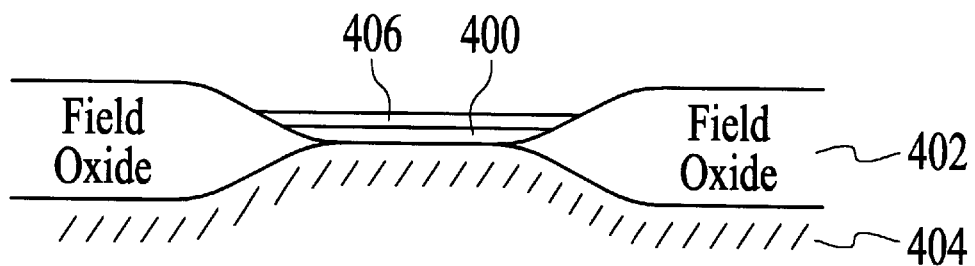

A fourth embodiment is shown in FIG. 4d which shows an oxynitride layer 400 beneath an oxide layer 406.

Figure 4E:
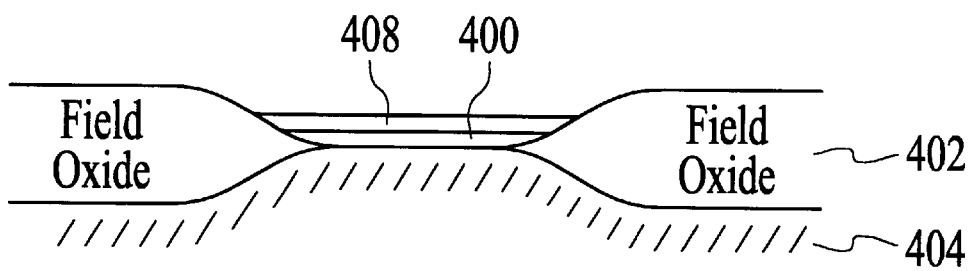

A fifth embodiment is shown in FIG. 4E where an amorphous silicon layer 408 is deposited on top of an oxynitride layer 400. The amorphous silicon layer is oxidized after being deposited on the oxynitride layer.

Figure 4F:
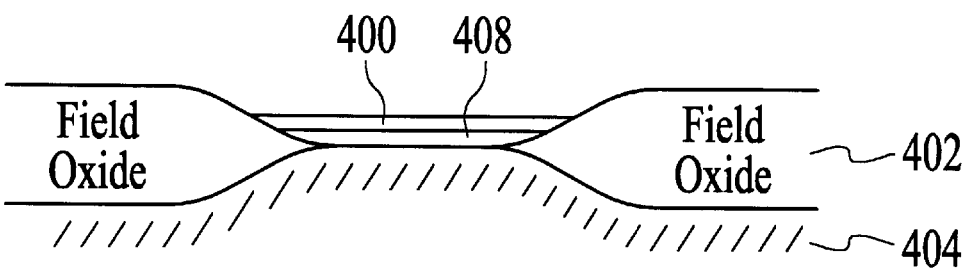

A sixth embodiment is shown in FIG. 4F where an amorphous silicon layer is deposited. The amorphous silicon layer 408 is then oxidized. Thereafter, an oxynitride layer is deposited over the oxidized amorphous silicon layer 408. In each scheme involving the deposition of oxynitride, with the possible exception of those demonstrated in FIG. 4E, the hydrogen in the oxynitride film is typically driven off by annealing in pure carrier gas ($N_2$, Ar), oxygen or diluted oxygen ambient at temperatures between 800 and 1000 degrees celsius.

The present invention offers several advantages over the conventional methods of gate oxidation. One such advantage is derived from the deposition of the dielectric rather than growing an oxide layer. When the dielectric is deposited over the substrate surface, the dielectric becomes insensitive to defects on the surface, thus avoiding the problems illustrated in FIGS. 2A–2B and FIGS. 3A–3B. Another advantage of using the oxynitride layer, as previously mentioned, is that the actually thickness of the oxynitride layer can be almost double the conventional oxide layer while still having an equivalent electrical thickness as the conventional oxide layer. A thicker layer of oxynitride is typically far easier to work with than the very thin layer of gate oxide used in the conventional methods.

Another advantage is that the method according to the present invention will produce a device which impedes boron infusion. During the boron implantation step shown in FIG. 1K, the implanted boron tends to diffuse towards the silicon substrate. In the current conventional processing methods, there is nothing to impede the progress of boron diffusion which degrades the gate oxide. Because of the nitrogen content of oxynitride, boron diffusion is impeded due to the tendency of nitrogen to impede boron diffusion.

Additionally, the voids in the matrix caused by the hydrogen bonding to either the silicon or the nitrogen can be avoided by utilizing the methods according the present invention. When oxynitride is introduced, oxygen replaces much of the hydrogen. The replacement of hydrogen by oxygen makes it possible for the crosslinking of the chains of the elements to continue. Consequently, the small voids which become a nucleus for ruptures with consequent propagation of cracks can be avoided. The film produced according to the present invention will be more robust with a lack of tendency toward fractures. The film manufactured according to the present invention will have a more uniformed distribution of stress, and it is therefore more reliable.

The sixth embodiment shown in FIG. 4F has the further advantage of creating a fresh surface to oxidize which has not been through any previous processes. Because this new surface has not had to endure various processes, it is typically lacking any faults or other defects such as those illustrated in FIGS. 2A–2B and 3A–3B.

Although the present invention has been described in accordance with the embodiments shown, one of ordinary skill in the art will readily recognize that there could be variations to the embodiments and that those variations would be within the spirit and scope of the present invention. Accordingly, many modifications may be made by one of ordinary skill in the art without departing from the spirit and scope of the appended claims.

I claim:

1. A method of manufacturing a semiconductor device comprising the steps of:
   a) providing a substrate;
   b) providing a field oxide coupled to the substrate;
   c) providing a gate dielectric structure, the gate dielectric structure being composed of a plurality of layers of dielectric material coupled to the substrate and the field oxide, each of the plurality of layers extending across all of the gate dielectric structure, the plurality of layers of dielectric material including a layer of oxynitride having a nitrogen content, the layer of oxynitride being deposited under a pressure using a stream of gas, wherein insensitivity to defects on a surface of the substrate results from the layer of oxynitride, the plurality of layers of dielectric material further including a first layer of oxide under the layer of oxynitride and a second layer of oxide over the layer of oxynitride, wherein at least the first layer of oxide is deposited; and
   d) providing a layer of polysilicon over the plurality of layers of dielectric material, wherein a doping substance is implanted in the polysilicon layer, and wherein the nitrogen content impedes diffusion of the doping substance through the gate dielectric structure toward the substrate.

2. The method of claim 1, wherein the plurality of layers of dielectric material is deposited.

3. The method of claim 1, wherein the plurality of layers of dielectric material further include a layer of oxide.

4. The method of claim 1 further comprising the step of:
   e) etching the polysilicon layer to provide a gate structure, wherein the gate dielectric structure extends under the entire gate.

5. The method of claim 1, wherein the plurality of layers of dielectric material further include a silicon layer.

6. The method of claim 5, further comprising step (c1) of oxidizing the silicon layer to form at least one of the first oxide layer or the second oxide layer.

7. The method of claim 5, wherein the silicon layer is amorphous.

8. The method of claim 5 wherein the silicon layer is on top of the layer of oxynitride.

9. The method of claim 8, further comprising step (c1) of oxidizing the silicon layer.

10. The method of claim 5 wherein the layer of oxynitride is on top of the silicon layer.

11. The method of claim 10, further comprising step (c1) of oxidizing the silicon layer prior to depositing the oxynitride layer.

12. A method for manufacturing a semiconductor device comprising the steps of:
   a) providing a substrate;
   b) providing a field oxide coupled to the substrate;
   c) providing a gate dielectric structure, the gate dielectric structure being composed of a plurality of layers of dielectric material including a layer of oxynitride deposited over the substrate and at least one layer of oxide, the layer of oxynitride having a nitrogen content, the layer of oxynitride being deposited under a pressure using a stream of gas, wherein insensitivity to defects on a surface of the substrate results from the layer of oxynitride, the layer of oxynitride and the layer of oxide extending across all of the gate dielectric structure, the plurality of layers of dielectric material further including a first layer of oxide under the layer of oxynitride and a second layer of oxide over the layer of oxynitride, wherein at least the first layer of oxide is deposited; and
   d) providing a layer of polysilicon over the oxynitride layer, wherein a doping substance is implanted in the polysilicon layer, and wherein the nitrogen content impedes diffusion of the doping substance through the gate dielectric structure toward the substrate.

13. The method of claim 12 further comprising the step of:
   e) etching the polysilicon layer to provide a gate structure, wherein the gate dielectric structure extends under the entire gate.

* * * * *